US008378495B2

(12) United States Patent
West

(10) Patent No.: US 8,378,495 B2
(45) Date of Patent: Feb. 19, 2013

(54) INTEGRATED CIRCUIT (IC) HAVING TSVS WITH DIELECTRIC CRACK SUPPRESSION STRUCTURES

(75) Inventor: Jeffrey A West, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 544 days.

(21) Appl. No.: 12/555,162

(22) Filed: Sep. 8, 2009

(65) Prior Publication Data

US 2011/0031581 A1 Feb. 10, 2011

Related U.S. Application Data

(60) Provisional application No. 61/232,757, filed on Aug. 10, 2009.

(51) Int. Cl.
*H01L 23/48* (2006.01)

(52) U.S. Cl. ........ 257/774; 257/686; 257/777; 257/723; 257/510; 257/472; 257/475; 257/680

(58) Field of Classification Search .................. 257/686, 257/E23.085, 777, 723, 774, 510, 472, 475, 257/737, 738, 680; 174/261
See application file for complete search history.

(56) References Cited

U.S. PATENT DOCUMENTS

| | | | | |
|---|---|---|---|---|
| 6,303,879 B1 * | 10/2001 | Burkhart | | 174/261 |
| 7,525,186 B2 * | 4/2009 | Kim et al. | | 257/686 |
| 2009/0184424 A1 * | 7/2009 | Furusawa et al. | | 257/758 |
| 2010/0078770 A1 * | 4/2010 | Purushothaman et al. | | 257/621 |
| 2011/0180936 A1 * | 7/2011 | Cobbley et al. | | 257/774 |

* cited by examiner

*Primary Examiner* — Michael Shingleton
(74) *Attorney, Agent, or Firm* — Steven A. Shaw; W. James Brady; Frederick J. Telecky, Jr.

(57) ABSTRACT

An IC includes a substrate having a semiconductor top surface, a plurality of metal interconnect levels having inter-level dielectric (ILD) layers therebetween on the top surface, and a bottom surface. A plurality of through substrate vias (TSVs) extend from a TSV terminating metal interconnect level downward to the bottom surface. The plurality of TSVs include an electrically conductive filler material surrounded by a dielectric liner that define a projected volume. The projected volume includes a projected area over the electrically conductive filler material and a projected height extending upwards from the TSV terminating metal interconnect level to a metal interconnect level above, and a projected sidewall surface along sidewalls of the projected volume. A crack suppression structure (CSS) protects TSVs and includes a lateral CSS portion that is positioned lateral to the projected volume and encloses at least 80% of the projected sidewall surface.

22 Claims, 4 Drawing Sheets

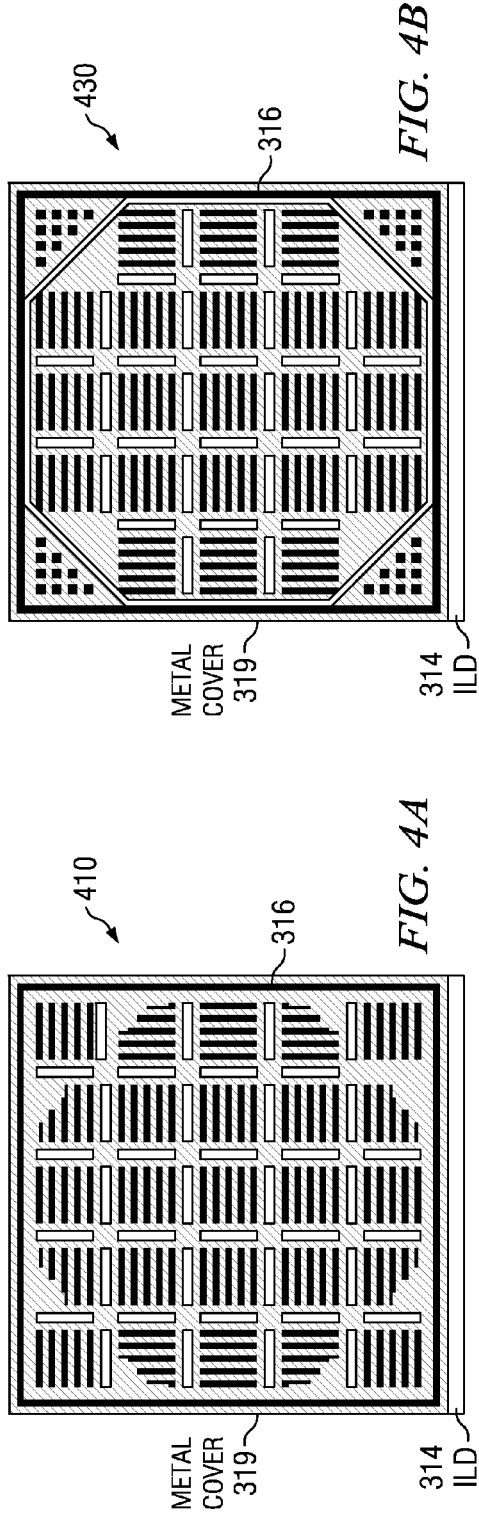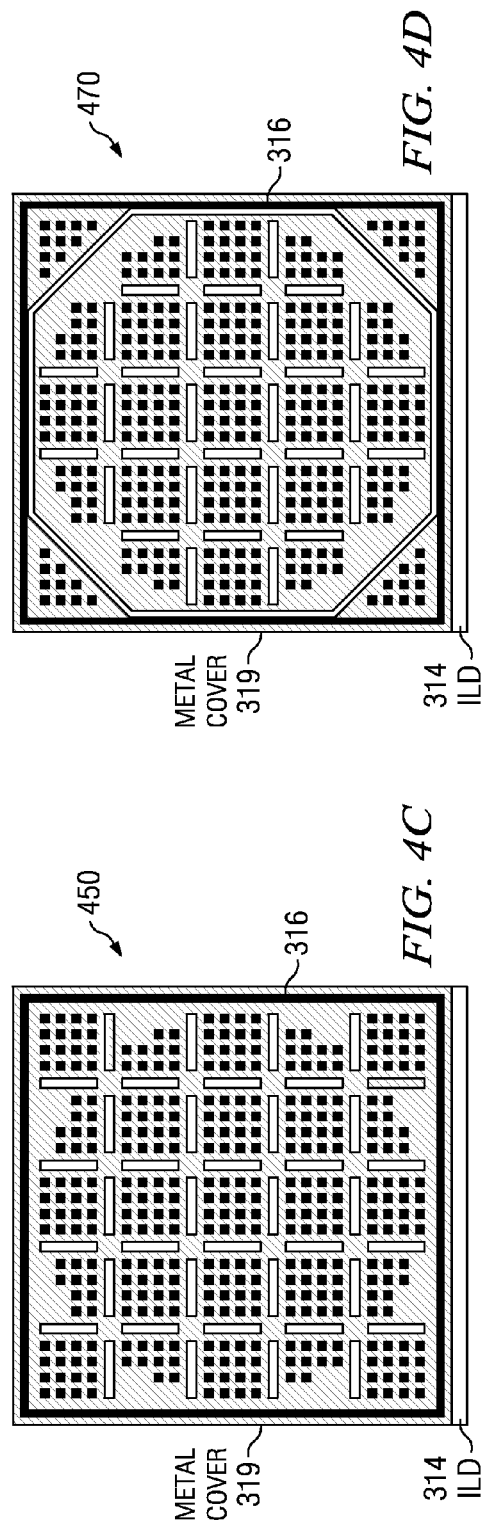

INTEGRATED CIRCUIT (IC) HAVING TSVS WITH DIELECTRIC CRACK SUPPRESSION STRUCTURES

CROSS REFERENCE TO RELATED APPLICATIONS

This application claims the benefit of Provisional Application Ser. No. 61/232,757 entitled "Integrated Circuit (IC) Having TSVs with Dielectric Crack Suppression Structures", filed Aug. 10, 2009, which is herein incorporated by reference in its entirety.

FIELD

Disclosed embodiments generally relate to the fabrication of integrated circuit (IC) devices and, more specifically, to ICs having through-substrate vias that include crack suppression structures.

BACKGROUND

Vias are routinely used in forming ICs. Vias may be formed that extend from the bottom of an IC die to one of the metal interconnect layers on the active or semiconductor top surface of the IC die. Such structures are often referred to as "through-silicon vias," and are referred to more generally herein as through-substrate vias (TSVs).

TSVs are generally framed by a dielectric liner and are then filled with copper or another electrically conductive TSV filler material to provide a low resistance vertical electrical connection between the bottom of the IC die and the active circuitry on the semiconductor top surface of the IC die. The active circuitry formed on the semiconductor top surface comprises circuit elements that generally include transistors, diodes, capacitors, and resistors, as well as signal lines and other conductors that interconnect these various circuit elements.

A diffusion barrier metal formed on the dielectric liner frames the TSV and protects against escape of the TSV filler material to the semiconductor in the case of highly mobile metal TSV filler materials such as copper. Copper, as well as some other TSV filler metals, have a significantly higher coefficient of thermal expansion (CTE) as compared to silicon. For example, copper has a CTE of approximately 17 ppm/° C., whereas silicon has a CTE of approximately 2 to 3 ppm/° C. This CTE mismatch can result in significant thermally induced stress in the silicon and copper (or other conductive material filling the TSV via) during certain fab processing (e.g., 360 to 410° C. sinters) subsequent to the fabrication of the TSV, as well as during assembly and test/operation induced temperature stress, as may occur during solder reflow (e.g., up to about 260° C.), during certain temperature cycle (e.g., −55° C. to 125° C.) reliability testing, or even during long-term field operation of the IC.

In addition, when the TSVs are spaced relatively close together such that their stress fields interact, these stresses may be further magnified. The stresses that may result from the above-described CTE mismatch can lead to numerous problems, including interfacial delamination, cracking of the semiconductor material (e.g., silicon) or the dielectric above or lateral to the TSV, and/or degraded transistor performance.

To reach advanced processed nodes, lower dielectric constant (k) materials as compared to silica (k=3.9) have been used to reduce parasitic capacitance, enabling ICs to provide better performance, such as faster switching speeds and lower heat dissipation. As used herein a "low-k" dielectric has a k-value<3.4. "Ultra low-k" dielectrics are a subset of low-k materials. As used herein, ultra low-k dielectrics have a dielectric constant of less than 2.5. As known in the art, ultra low-k dielectrics tend to be significantly more brittle than conventional silica. Used in conjunction with TSVs, ultra low-k dielectrics (e.g. for inter-level dielectrics (ILDs)) are prone to cracking, particularly when the TSV filler metal (e.g., copper) has a CTE that is significantly different (and generally higher) as compared to the semiconductor (e.g., silicon). In the case of assembly based on thermo-compression bonding, mechanical stresses on the IC side of the TSV can be induced by thermo-compression bonding of the TSV tip, thus creating an opportunity for crack formation in the surrounding brittle low-k dielectric.

A number of solutions have been proposed to reduce problems caused by CTE mismatches for ICs having TSVs. Some solutions rely on TSV geometry or spacing. For example, one solution reduces the diameter of TSVs in order to reduce the stress from each TSV. This solution raises the TSV resistance. Another solution is to position the TSVs far apart from one another to limit the interaction of the stress fields between adjacent TSVs. A further solution is to position the TSVs far from any active circuitry to ensure stress fields do not penetrate the area proximate the active circuitry. Spacing solutions reduce packing density and can add resistance.

Some solutions rely on material substitutions. For example, tungsten (W) can be substituted for copper (Cu) to reduce the CTE mismatch with silicon. However, switching the TSV metal to W adds significant resistance (W has about 5× the resistance as compared to Cu) and can complicate processing since W does not generally allow direct electroplating.

Some other solutions rely on process changes. For example, the TSVs can be formed later in the process by etching through the entire back end of the line (BEOL) stack (multi-level metals and inter-level dielectrics (ILDs)) after BEOL processing thus avoiding putting the TSVs through the significant thermal cycling (e.g., 360 to 410° C. sinters) associated with BEOL processing. However, this approach blocks the ability to place routing channels (e.g., signal carrying) over the top of the TSVs since the TSVs in this process pass through all BEOL layers (i.e. including all metal interconnect levels). Moreover, as noted above, significant CTE induced stress can still occur from post BEOL processing, such as solder reflow during assembly.

SUMMARY

As described above, significant CTE differences between the semiconductor (e.g., Si) and the TSV fill material (e.g., Cu) comprising the TSVs can generate damage (e.g., cracks) in the surrounding dielectric (e.g., low-k or ultra low-k ILD) during temperature cycling, even for modest temperature excursions from room temperature, such as chilling to −40° C., or heating to 150° C. The Inventor has discovered that crack suppression structures (CSS) described herein prevent or suppress the initiation and arrest the propagation of cracks in the dielectric surrounding the TSVs, including the ILD lateral to and above the TSVs, thus improving IC reliability. Moreover, the CSS can act as a second line of defense should the diffusion barrier metal fail by providing a block to TSV fill material (e.g., Cu) diffusion egress from the TSV.

Using CSS described herein, to combat CTE mismatch thermally triggered dielectric cracking surrounding the TSVs there is generally no need to include TSV geometry changes (e.g., reduced TSV diameter) which increases TSV resistance, increase the TSV spacing which reduces IC packing density, or resort to filler material changes (e.g., W instead of Cu) which increase TSV resistance and complicates processing. Moreover, process solutions are generally not needed, such as delaying TSV formation to after BEOL (i.e. after all metal interconnect levels) processing thus avoiding putting the TSVs through the high temperatures (e.g., 360 to 410° C. sinter) associated with BEOL processing. As described above, such process solutions block the ability to place routing channels over the TSVs since the TSVs in such a process pass through all BEOL layers (i.e. including all metal interconnect levels). Moreover, such process solutions may be subject to significant CTE induced stress from post BEOL processing, such as solder reflow during assembly, which can result in initiation and propagation of cracks in the dielectric surrounding the TSVs.

As described herein, the CSS comprises a lateral CSS portion that is positioned lateral to a projected volume of the TSV. The projected volume comprises a projected area defined by an area of the electrically conductive TSV filler material and a projected height extending upwards from a TSV terminating metal interconnect level to at least one of the plurality of metal interconnect levels that are above the TSV terminating metal interconnect level. The projected volume has a projected sidewall surface along sidewalls of the projected volume. The lateral CSS portion encloses at least 80% of the projected sidewall surface, and in certain embodiments of the invention encloses 100% of the projected sidewall surface.

The CSS can further comprise a capping CSS portion positioned over the crack protected TSVs. The capping CSS portion comprises at least one protective capping volume comprising at least one metal cover positioned over the projected area, wherein the metal cover is formed from one of the plurality of metal interconnect levels above the TSV terminating metal interconnect level. As used herein, the term "metal cover" includes both continuous (unpatterned/solid) metal covers and discontinuous (patterned) metal covers. Discontinuous metal covers include one or more gaps (e.g. holes) in the metal cover. The metal cover connects to a plurality of vias formed in the ILD layer that is positioned immediately below the metal cover, wherein the vias are generally filled with the same metal used for the metal cover (e.g., copper).

The vias can be slot-shaped (e.g., rectangular), as opposed to conventional circular vias to compensate for thicker ILD over TSVs that can result from dishing of the TSV filler material during TSV chemical-mechanical polishing (CMP). Slot-shaped vias also reduce the amount of dielectric (e.g., low-k dielectric) above each TSV as compared to conventional circular cross sectioned vias. Slot-shaped vias also generally lower the TSV resistance as compared to circular vias.

Since embodiments of the invention allow reliably embedding TSVs below the top level metal, and in one embodiment below the bottom-most metal interconnect level (M1), the volume above the TSV becomes available for routing lines, which when utilized leads to a smaller die size. Moreover, embedding TSVs below the top level metal allows for a simpler process for the TSV etch compared to a process comprising TSV formation after BEOL, since the process for embedding TSVs below the top level metal does not require etching through all the ILD levels.

BRIEF DESCRIPTION OF THE DRAWINGS

FIGS. 4A-D show protective capping volumes showing some exemplary metal cover designs for metal levels several levels above the TSV terminating metal level, according to embodiments of the invention.

DETAILED DESCRIPTION

Figure 1:
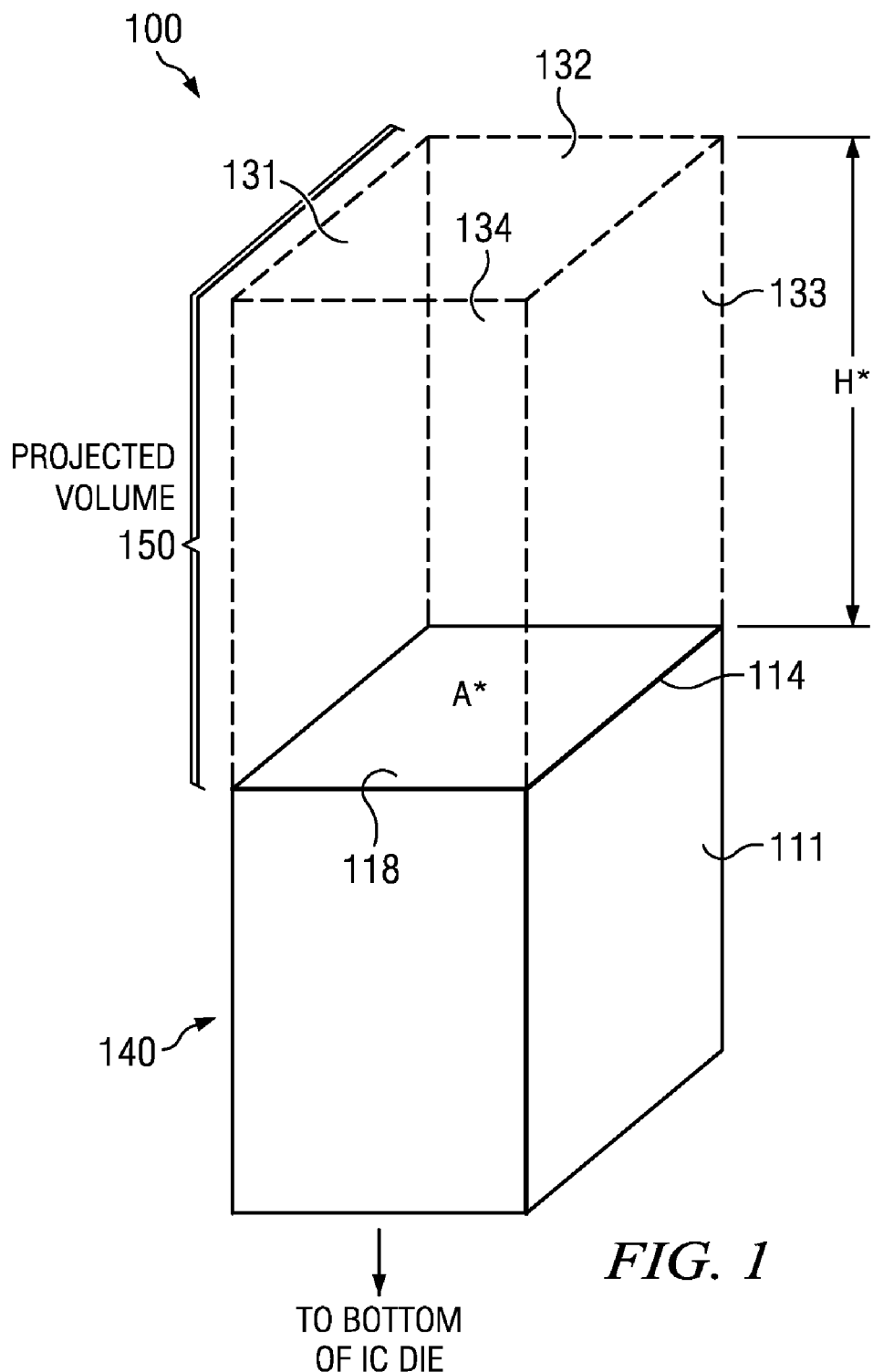
FIG. 1 is a demonstrative figure that clarifies what is meant by projected volumes that are defined by geometry of the TSVs that are used herein to describe the lateral CSS portion according to embodiments of the invention that enclose at least 80% of the projected sidewall surface of the projected volume.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

FIG. 1 is a demonstrative figure that clarifies what is meant by projected volumes that are defined by the geometry of TSVs and used herein to describe the lateral CSS portions according to embodiments of the invention that enclose at least 80% of the projected sidewall surface area of the projected volume. A square TSV 140 is shown having only its TSV filler material 111 shown for simplicity. The diffusion barrier layer and dielectric liner which are generally included with TSV 140 are not shown in FIG. 1. Although a "square" TSV 140 is shown in FIG. 1, embodiments of the invention are not limited to square cross-sectioned TSVs, such as circular TSVs.

The projected volume 150 shown in FIG. 1 is immediately above TSV 140 and comprises a projected area A* defined by an area of the electrically conductive filler material 111 measured at its top surface 114 which forms an interface with a terminating metal interconnect level 118, such as M1, M2, etc., up to the top level metal. A projected height H* extends upwards from the top surface 114 of the TSV terminating metal interconnect level to at least one of the plurality of metal interconnect levels above the TSV terminating metal interconnect level. For example, if the TSV terminating metal interconnect level is M1, the metal interconnect level above the TSV terminating metal interconnect level can be M2 up to and including the top level metal interconnect. The projected sidewall surface is along the four (4) sidewalls of the projected volume 150, with the respective sidewall surfaces identified in FIG. 1 as 131 (left side wall), 132 (back wall), 133 (right side wall) and 134 (front wall).

Figure 2:
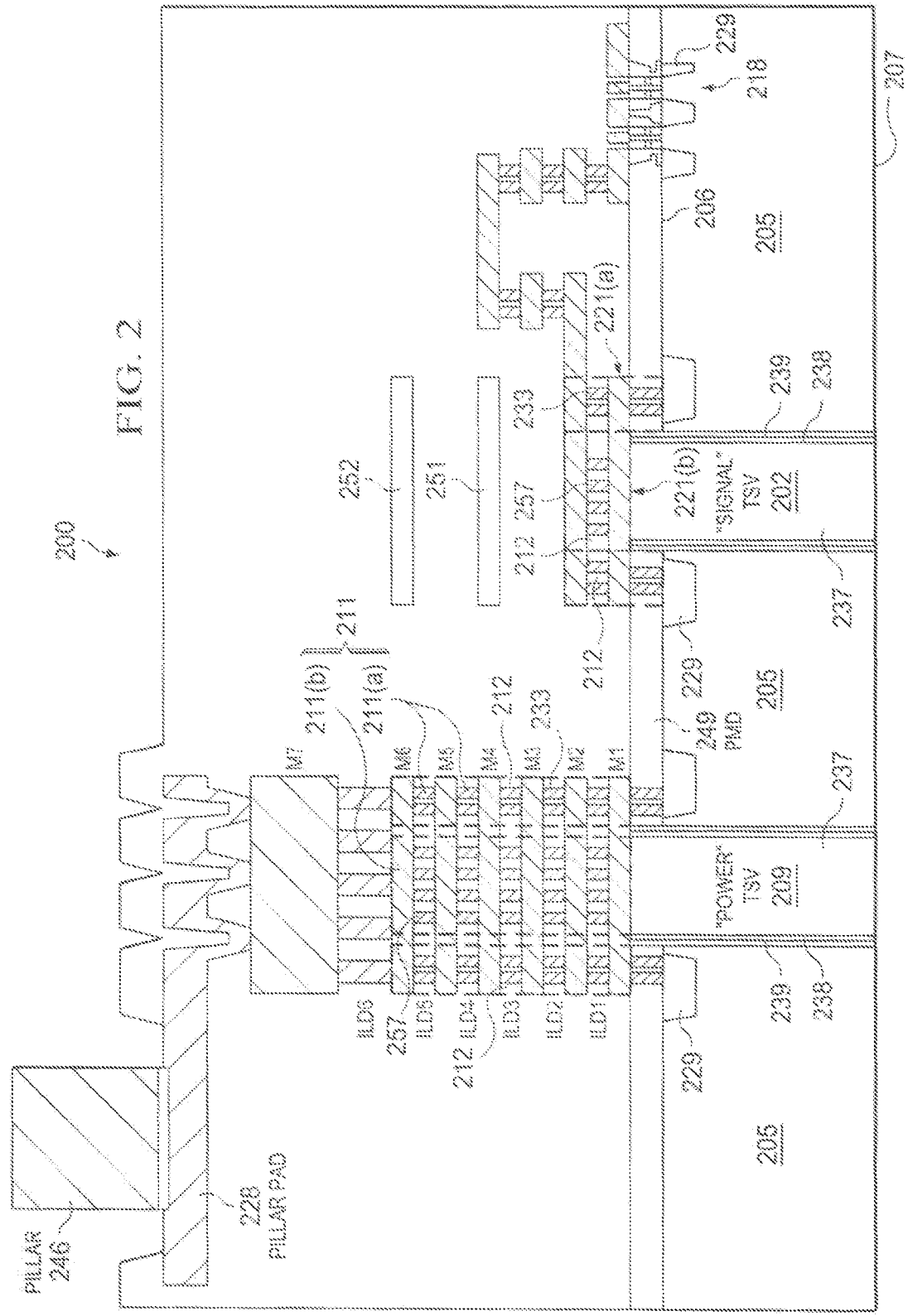
FIG. 2 is a simplified cross sectional depiction of an IC comprising a plurality of TSVs including a "power TSV" and a "signal TSV" that each has a CSS for preventing the initiation and arresting the propagation of cracks in the dielectric proximate to the TSV, according to an embodiment of the invention.

FIG. 2 is a simplified cross sectional depiction of an IC 200 comprising a plurality of TSVs including a "power TSV" 209 and a "signal TSV" 202 that each has a CSS according to an embodiment of the invention. CSS 211 comprising a lateral CSS portion 211(a) and a capping CSS portion 211(b) is associated with power TSV 209 and CSS 221 comprising a lateral CSS portion 221(a) and a capping CSS portion 221(b) is associated with signal TSV 202 for preventing the initiation and arresting the propagation of cracks in the dielectric 212 surrounding TSVs 202 and 209.

IC 200 comprises a substrate 205 having a semiconductor top surface 206, such as a silicon or silicon germanium top surface, and a bottom substrate surface 207. IC 200 includes a plurality of metal interconnect levels including a first to seventh metal interconnect level M1-M7, a pre-metal dielectric (PMD) 249 between the semiconductor top surface 206 and M1, and ILD layers comprising ILD1, ILD2, ILD3, ILD4, ILD5 and ILD6 shown comprising an ILD material 212 between respective ones of the plurality of metal interconnect levels M1 to M7. ILD material 212 can comprise a low-k or an ultra low-k dielectric layer, and be different (or the same) material for each of the ILD1, ILD2, ILD3, ILD4, ILD 5 and ILD6 layers.

Active circuitry shown as transistor 218 is formed on semiconductor top surface 206. Transistor 218 is shown coupled to the signal TSV 202 by one of the many possible connection options comprising M1, M2, M3 and M4 and associated vias as shown in FIG. 2.

The power TSV 209 is seen providing a feed through the substrate 205 for connection on the top of the IC 200, such as to the pillar pad 228. Power TSV 209 generally provides a power connection, such as VDD, VSS or Ground to a device above IC 200, with only the copper pillar 246 of the device mounted above IC 200 being shown in FIG. 2.

Signal TSV 202 is shown in FIG. 2 connecting to active circuitry on IC 200 shown as transistor 218 to a signal source that couples the signal to the TSV connection provided by signal TSV 202 at the bottom substrate surface 207. As described above, since signal TSV 202 is embedded below M1 and is thus embedded below the top level metal interconnect for IC 200 (M7), the volume above signal TSV 202 becomes available for routing lines. IC 200 is shown including an M4 routing line 251 and an M6 routing line 252 above signal TSV 202. Positioning routing lines above TSVs as shown in FIG. 2 leads to a smaller die size as compared to routing restricted to lateral to the TSVs.

TSVs 202 and 209 comprise TSV filler material (e.g., copper or other metal) 237 that can be seen to extend from M1 which functions as the TSV terminating metal interconnect level for TSVs 202 and 209 on IC 200 downward to the bottom surface 207. The TSV filler material 237 is shown surrounded by diffusion barrier metal (e.g., Ta, TaN, Ti, TiN, Mn, or Ru, or combinations thereof) 238 then an outer dielectric liner 239. Seed metal generally present under TSV filler material 237 when TSV filler material 237 comprises electroplated rapid diffusing minority carrier lifetime harming metals such as copper is not shown.

TSVs 202 and 209 each defines a projected volume as described above relative to FIG. 1. The lateral CSS portions 211(a) for power TSV 209 and 221(a) for the signal TSV 202 can be seen to comprise vias 233 and be positioned laterally to the respective projected volumes, generally at a distance of 2 to 10 μms to the sidewalls of the projected volume, and enclose at least 80% (100% shown in FIG. 2) of respective projected sidewall surface area. The lateral CSS portion 211(a) can be seen to extend down to the semiconductor top surface 206, and as shown in FIG. 2, extends to dielectric filled trench isolation regions 229 in the semiconductor top surface 206.

Capping CSS portion 211(b) for power TSV 209 and capping CSS portion 221(b) for the signal TSV 202 are seen to be positioned over the respective TSVs. Capping CSS portions 211(a) and 221(b) each comprise at least one protective capping volume comprising a metal cover, that as noted above can include one or more holes in the metal cover, positioned over the projected area (and optionally as shown in FIG. 2 extending beyond the projected area). For example, see FIGS. 4A-D described below. The metal covers are formed from the metal interconnect levels (M2, M3, . . . ) above the TSV terminating metal interconnect level shown as M1 in FIG. 2, comprising M2, M3, M4, M5, and M6 over power TSV 209, and M2 over signal TSV 202. The protective capping volumes include metal filled vias 257 that provide a low resistance vertical connection to the respective TSVs from one or more of the metal interconnect levels (metal covers) above the TSV terminating metal interconnect level. FIGS. 3A-B and FIGS. 4A-D described below show some exemplary protective capping volume designs having different metal cover designs, and describe this feature in more detail.

As shown in FIG. 2, the metal covers associated with the capping CSS portions 211(b) and 221(b) include an area that extends beyond the projected area of the TSV sufficiently to intersect the respective lateral CSS portion. In a typical embodiment wherein vias 233 are filled with metal, the lateral CSS portions are effectively shorted to their associated capping CSS portion. In this embodiment both the lateral CSS portion and the capping CSS portion is coupled by metal to its associated TSV.

Although IC 200 shows both power TSV 209 and signal TSV 202 terminating at M1 that defines their TSV terminating metal interconnect level, in other embodiments of the invention the TSV terminating metal interconnect level can terminate at metal levels above M1, including the top level metal interconnect (M7 shown in FIG. 2). The process to form such TSVs would still be a via-middle process since the TSV is etched and filled with an electrically conductive filler before the formation of at least one metal interconnect level.

In typical embodiments the CSS metal covers and vias comprise the interconnect metals to simplify the processing. For example, in embodiments the metal interconnect metal comprises copper, the metal covers and the vias can also comprise copper and be deposited using the same masking (single patterning) level. However, in an alternate embodiment of the invention, a double patterning process is used to separately define and etch the lateral CSS portion vias 233 and then fill the vias with a non-metal, rather than using the metal interconnect to fill vias 233, along with the capping CSS portion vias. Some exemplary non-metal crack-suppressing materials include polymers such as paralyne, BCB, PBO, polyimides, photoresist and bottom anti-reflective coatings (BARCs).

Although FIG. 2 shows the lateral and capping CSS with perfectly aligned vias, the via location can jog laterally from one metal level to another over a short distance (i.e., the via 1 trench does not have to be coincident to the via 2 trench, etc.) In addition, although IC 200 shows all TSVs shown (power TSV 209 and signal TSV 202) including CSS, only a portion of the TSVs may include CSS in other embodiments. Moreover, although IC 200 shows each TSV having its own dedicated CSS, embodiments of the invention include designs in which one lateral CSS portion protects a plurality of regions associated with a plurality of TSVs. For example, a CSS can surround 2, 3, 4, . . . TSVs.

Figure 3A:
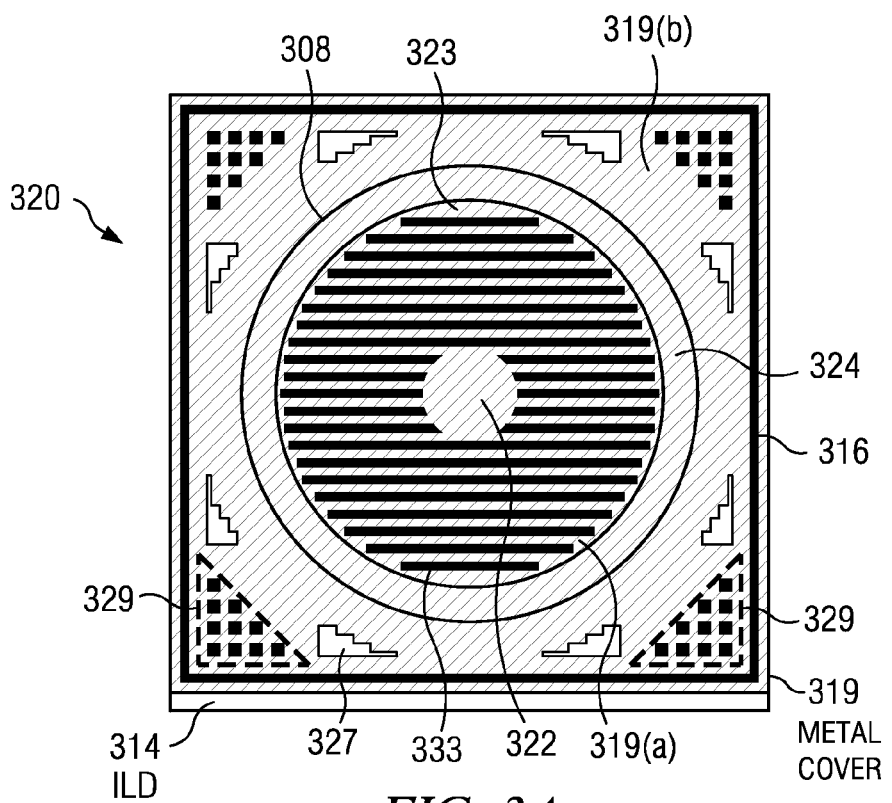
FIGS. 3A and 3B show protective capping volumes showing some exemplary metal cover designs for metal levels close to or acting as the TSV terminating metal level, according to embodiments of the invention.
Figure 3B:
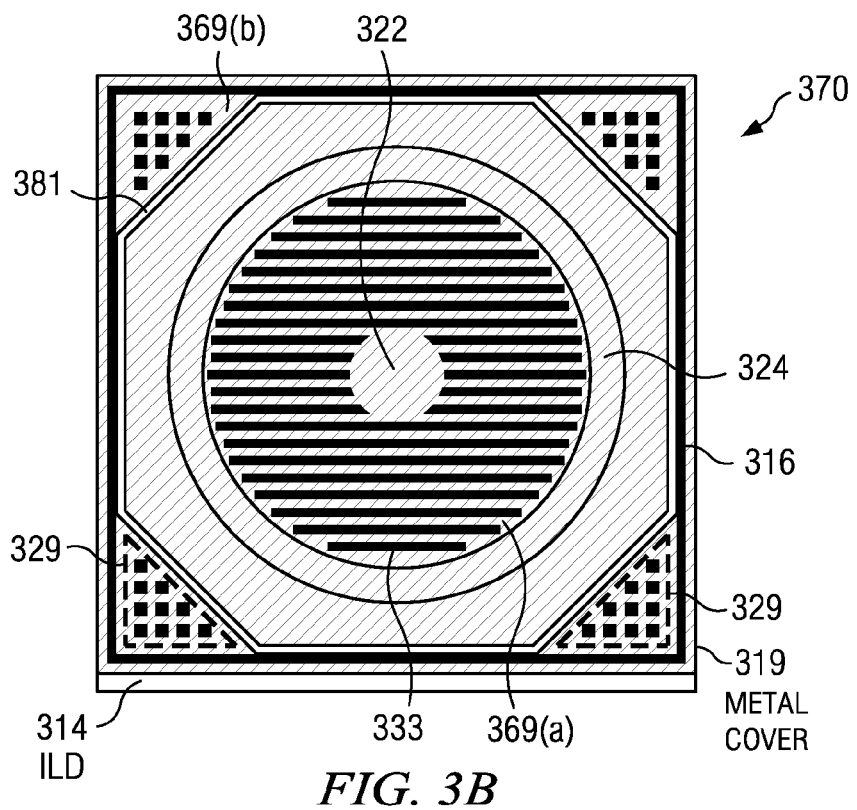

FIGS. 3A and 3B show protective capping volumes showing some exemplary metal cover designs for metal levels close (e.g., within 1 or 2 levels) to or acting as the TSV terminating metal level, according to embodiments of the invention. The protective capping volume 320 shown in FIG. 3A comprises a metal cover 319 on an ILD layer 314, such as a low-k or ultra low-k dielectric. The outer TSV boundary (from the TSV below projected upward) is shown as 308. The inner portion of metal cover 319 is defined to be within outer TSV boundary 308 and is identified as capping CSS portion 319(a), while the outer portion of metal cover 319 is defined to be outside outer TSV boundary 308 and is identified as lateral CSS portion 319(b). The interface regions on respective sides of outer TSV boundary 308 can be seen to short together capping CSS portion 319(a) and lateral CSS portion 319(b).

Capping CSS portion 319(a) includes a solid center core portion 322, via-comprising middle portion 323, and solid outer portion 324. Solid core portions 322 and 324 are provided to address the topographic anomalies expected of these respective regions. For example, seams (i.e. voids) tend to form at the center of a TSV when electroplating metal (e.g., copper) into the via. Via-comprising middle portion 323 comprises a plurality of via slots 333 that reduce TSV resistance in the vertical direction above the TSV (not shown) as compared to square vias. Slots 333 also provide structural support by occupying a significant portion of the area that would otherwise be occupied by ILD 314, that is generally low-k or ultra low-k which provides reduced low-k over the TSV, and thus provides crack suppression.

Moreover, slots 333 combined with square via holes (e.g. square on the reticle results in round shape in the fabricated cross-section) in the CSS lateral portion 319(b) as shown in FIG. 3A provides at least one processing advantage. Specifically, for some BEOL integration schemes incorporating spin-on low-k dielectrics, the ILD 314 can be thicker over a TSV that is dished by CMP processing as compared to the ILD thickness away from the TSV (over CSS lateral portion 319(b)). Since slotted vias provide a lower effective aspect ratio at etch relative to unslotted vias, a higher etch rate can be achieved compared to square "holes," and as such, the inclusion of slots 333 in Capping CSS portion 319(a) in via-comprising middle portion 323 can compensate for thicker ILD over via-comprising middle portion 323 as compared to the ILD thickness over lateral CSS portion 319(b).

Lateral CSS portion 319(b) includes a periphery trench ring region 316 for crack suppression. Lateral CSS portion 319(b) also includes corner non-slotted (square on the reticle, round as fabricated) via arrays 329 for reduced TSV resistance and crack stop. Corner contact arrays are provided for TSV CMP PMD erosion control that are positioned beneath the outer corner elements of the via arrays 329 (and are thus not shown in FIG. 3A or 3B). Lateral CSS portion 319(b) also includes eight (8) openings/holes (no metal) 327 to help suppress the tendency for wide metal dishing during CMP.

The protective capping volume 370 shown in FIG. 3B is similar to the protective capping volume 270 shown in FIG. 3A, except CSS capping portion 369(a) and lateral CSS portion 369(b) can be seen to be electrically isolated by an octagonally shaped region 381 without metal. As a result, lateral CSS portion 369(b) is electrically isolated from the underlying TSV. Electrically coupling CSS capping portion 369(a) and lateral CSS portion 369(b) results in a lower resistance over the TSV, such as to pillar pad 228 shown in FIG. 2, and a higher capacitance as compared to embodiments that electrically isolate CSS capping portion 369(a) and lateral CSS portion 369(b).

FIGS. 4A-D show protective capping volumes showing some exemplary metal cover designs for metal levels generally several levels above the TSV terminating metal level, according to embodiments of the invention. The metal cover designs shown in FIGS. 4A-D each includes a plurality of features that constitute regions without metal, thus being "holes" in the metal cover. The actual number of vias in the via arrays shown are generally set by the applicable design rule (DR) limit. FIG. 4A shows a protective capping volume 410 comprising slotted vias with a non-isolated periphery, according to an embodiment of the invention. FIG. 4B shows a protective capping volume 430 comprising slotted vias with isolated periphery. FIG. 4C shows a protective capping volume 450 comprising via arrays/farms with a non-isolated periphery. FIG. 4D shows a protective capping volume 470 comprising via arrays/farms with an isolated periphery.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

The invention claimed is:

1. An integrated circuit (IC), comprising:
  a substrate having a semiconductor top surface having active circuitry thereon including a plurality of metal interconnect levels including a first metal interconnect level and a top metal interconnect level having inter-level dielectric (ILD) layers between respective ones of said plurality of metal interconnect levels, and a bottom surface;
  a plurality of through substrate vias (TSVs) extending from a TSV terminating metal interconnect level selected from said plurality of metal interconnect levels downward to said bottom surface, said plurality of TSVs comprising an electrically conductive filler material surrounded by a dielectric liner, said TSVs defining a projected volume, said projected volume comprising a projected area defined by an area of said electrically conductive filler material of said TSVs and a projected height extending upwards from said TSV terminating metal interconnect level to at least one of said plurality of metal interconnect levels above said TSV terminating metal interconnect level, and a projected sidewall surface along sidewalls of said projected volume:, and
  a crack suppression structure (CSS) for at least a protected portion of said plurality of TSVs, said CSS comprising a lateral CSS portion positioned lateral to said projected volume formed as vias in at least a first of said ILD layers which are filled with a crack suppression material different from a dielectric material for said first ILD layer, said lateral CSS portion enclosing at least 80% of said projected sidewall surface.

2. The IC of claim 1, wherein said lateral CSS portion encloses 100% of said projected sidewall surface.

3. The IC of claim 1, wherein said lateral CSS portion extends down to said semiconductor top surface.

4. The IC of claim 3, further comprising trench isolation regions on said semiconductor top surface, wherein said lateral CSS portions extend downward to said trench isolation regions.

5. The IC of claim 1, wherein said electrically conductive filler material and said CSS comprise copper and said semiconductor top surface comprises silicon.

6. The IC of claim 1, wherein said lateral CSS portion is on average <10 µm away from said projected sidewall surface.

7. The IC of claim 1, wherein said crack suppression material comprises at least one metal.

8. The IC of claim 7, wherein said lateral CSS portion is coupled by said metal to at least one of said plurality of TSVs.

9. The IC of claim 1, wherein said crack suppression material comprises at least one polymer.

10. The IC of claim 1, wherein said lateral CSS portion is electrically isolated from said plurality of TSVs.

11. The IC of claim 1, wherein at least one of said ILD layers comprise a low-k or an ultra low-k dielectric layer.

12. The IC of claim 1, wherein said TSV terminating metal interconnect level is said first metal interconnect level.

13. The IC of claim 1, wherein said CSS further comprises a capping CSS portion positioned over respective ones of said protected portion of said plurality of TSVs, said capping CSS portion comprising:
  at least one protective capping volume, each protective capping volume comprising:
    a metal cover positioned over said projected area, said metal cover formed from one of said plurality of metal interconnect levels above said TSV terminating metal interconnect level; and
  wherein said vias are positioned immediately below said metal cover and are coupled to said metal cover, said vias extending through said ILD layer to coupled to a respective one of said plurality of metal interconnect levels positioned immediately below said metal cover.

14. The IC of claim 13, wherein said vias include at least in part slot-shaped vias.

15. The IC of claim 14, wherein said vias include square or circular-shaped vias.

16. The IC of claim 13, wherein said metal cover includes a solid core portion in a center of said metal cover.

17. The IC of claim 1, wherein said plurality of said metal interconnect levels include at least one capping metal interconnect level that is above said TSV terminating metal interconnect level, and wherein said capping metal interconnect level includes at least one routing line coupled to said active circuitry.

18. The IC of claim 13, wherein said capping CSS portion and said lateral CSS portion are electrically isolated from one another.

19. The IC of claim 13, wherein said capping CSS portion and said lateral CSS portion are electrically coupled to one another.

20. An integrated circuit (IC), comprising:
  a substrate having a semiconductor top surface having active circuitry thereon including a plurality of metal interconnect levels including a first metal interconnect level and a top metal interconnect level having inter-level dielectric (ILD) layers between respective ones of said plurality of metal interconnect levels, and a bottom surface;
  a plurality of through substrate vias (TSVs) extending from a TSV terminating metal interconnect level selected from said plurality of metal interconnect levels downward to said bottom surface, said plurality of TSVs comprising an electrically conductive filler material surrounded by a dielectric liner, said TSVs defining a projected volume, said projected volume comprising a projected area defined by an area of said electrically conductive filler material of said TSVs and a projected height extending upwards from said TSV terminating metal interconnect level to at least one of said plurality of metal interconnect levels above said TSV terminating metal interconnect level, and a projected sidewall surface along sidewalls of said projected volume; and
  a crack suppression structure (CSS) for at least a protected portion of said plurality of TSVs, said CSS comprising a lateral CSS portion positioned lateral to said projected volume formed as vias in at least a first of said ILD layers which are filled with a crack suppression material different from a dielectric material for said first ILD layer, said lateral CSS portion and encloses 100% of said projected sidewall surface,
  wherein said electrically conductive filler material and said CSS comprise copper and said semiconductor top surface comprises silicon.

21. The IC of claim 20, wherein said CSS further comprises a capping CSS portion positioned over respective ones of said protected portion of said plurality of TSVs, said capping CSS portion comprising:
- at least one protective capping volume, each protective capping volume comprising:
  - a metal cover positioned over said projected area, said metal cover formed from one of said plurality of metal interconnect levels above said TSV terminating metal interconnect level; and
  - vias positioned immediately below said metal cover and is coupled to said metal cover, said vias extending through said ILD layer to coupled to a respective one of said plurality of metal interconnect levels positioned immediately below said metal cover.

22. The IC of claim 20:
- wherein said at least one protective capping volume comprises a plurality of said protective capping volumes stacked on one another, and
- wherein a bottom-most of said plurality of said protective capping volumes is coupled to said TSV terminating metal interconnect level by ones of said vias associated with said bottom-most of said plurality of said protective capping volumes, and
- wherein others of said plurality of said protective capping volumes are coupled to one another by said vias associated with an upper one of said protective capping volumes coupled to said metal cover of a lower one of said protective capping volumes.

* * * * *